(12) United States Patent
Kuriyama et al.

(10) Patent No.: US 6,670,282 B2
(45) Date of Patent: Dec. 30, 2003

(54) METHOD AND APPARATUS FOR PRODUCING SILICON CARBIDE CRYSTAL

(75) Inventors: Haruyoshi Kuriyama, Ama-gun (JP); Hiroyuki Kondo, Kariya (JP); Shouichi Onda, Toyokawa (JP); Kazukuni Hara, Kasugai (JP)

(73) Assignee: Denso Corporation, Kariya (JP)

( * ) Notice: Subject to any disclaimer, the term of this patent is extended or adjusted under 35 U.S.C. 154(b) by 205 days.

(21) Appl. No.: 09/954,209

(22) Filed: Sep. 18, 2001

(65) Prior Publication Data

US 2003/0054660 A1 Mar. 20, 2003

(51) Int. Cl.$^7$ .................. H01L 21/31; H01L 21/469
(52) U.S. Cl. .................. 438/758; 438/909; 438/931
(58) Field of Search ................. 438/758, 767, 438/779, 782, 909, 931

(56) References Cited

U.S. PATENT DOCUMENTS 6,261,363 B1 * 7/2001 Vodakov et al.

FOREIGN PATENT DOCUMENTS

| JP | A-8-295595 | 11/1996 |
|---|---|---|
| JP | B2-2868328 | 12/1998 |
| JP | A-2000-336000 | 12/2000 |

* cited by examiner

Primary Examiner—Phuc T. Dang
(74) Attorney, Agent, or Firm—Posz & Bethards, PLC (57) ABSTRACT

To produce a SiC crystal in a shape which is used as a wafer, a guide is disposed around a SiC crystal substrate so as to cover a peripheral portion of the SiC crystal substrate. Temperature of the guide may be made higher than the sublimation temperature of the SiC when a SiC crystal is disposed upon and caused to grow on the SiC crystal substrate, thereby controlling and restricting the SiC crystal growth in the direction of the guide. Additionally, when the guide is formed in a substantially hexagonal tube shape, the SiC crystal can be produced in a hexagonal pole shape. In this case, when alignment is made between each diagonal passing through a center of the hexagon shape of the guide and specific direction ($<11\bar{2}0>$ or $<1\bar{1}00>$ of the SiC crystal substrate), the SiC crystal becomes aligned accordingly.

23 Claims, 10 Drawing Sheets

<11$\bar{2}$0> DIRECTION

<1 1 $\bar{2}$ 0> DIRECTION
OR <1 $\bar{1}$ 0 0> DIRECTION

METHOD AND APPARATUS FOR PRODUCING SILICON CARBIDE CRYSTAL

BACKGROUND OF THE INVENTION

1. Field of the Invention

The present invention relates to a method and an apparatus for producing a silicon carbide (SiC) crystal used for a material of a semiconductor, a light emitting diode and the like.

2. Description of Related Art

SiC crystals are typically used in semiconductors, light emitting diodes and other crystal accepting devices and applications. While current crystal producing methods have generally proven to be satisfactory for their applications, each is associated with its share of limitations. One major limitation with many current crystal producing methods and apparatuses is their inability to produce a crystal in a controlled form to achieve a precise shape and size of crystal.

The problem of producing application SiC crystals in a conventional method has been addressed by the prior art and is disclosed in JP-A-8-295595 as the following method. That is, a Sic material is disposed at a lower portion of a container such as a graphite crucible while a SiC seed crystal is disposed at an upper portion thereof. The temperature of the SiC seed crystal is made lower than a temperature of the SiC material. By sublimation, a SiC gas emits from the Sic material and is supplied onto the SiC seed crystal to make the SiC crystal grow. The SiC crystal grows downward so that its diameter is enlarged in a divergent shape. Since the SiC crystal finally becomes a bulk shape different from a shape to be used, the bulk shape is required to be suitably changed to a desired, usable shape, such as a wafer. However, since a SiC crystal is very hard, changing its shape is difficult. This inability to produce a crystal in a precise shape and size has resulted in additional crystal processing to achieve the precise shape and size crystal for the given application.

Another major limitation with current crystal producing methods and apparatuses is their inability to produce a crystal free of crack defects which generally originate in a crack core. In general, prior art methods of producing a SiC crystal results in crystal growth speeds that are different between a center portion and a peripheral portion of a crystal growing surface. The center portion of a SiC crystal ingot, having grown, may either protrude or recess relative to its peripheral surface. Therefore, crystal defects, especially crack defects, are generated in the growing SiC crystal.

Therefore, a generation mechanism of a crack defect is considered. When a crystal growing surface of the SiC crystal to grow is irregular, its cross-sectional shape becomes different from a circle. Therefore, a circle is supposed as the cross-sectional shape of the SiC crystal as in FIG. 13A, and the generation mechanism of the crack defects will be described in this circular model.

Figure 13A:
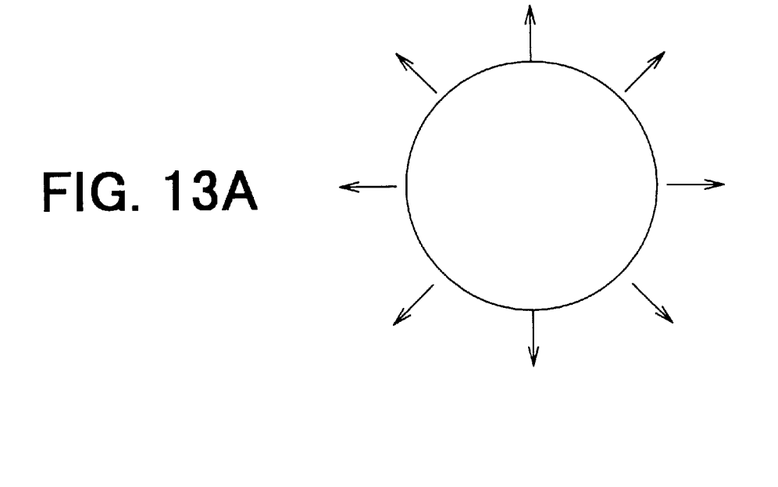
FIG. 13A is an explanation view showing a generation mechanism of crack defects and arrows noting the directions of SiC crystal growth.
Figure 13B:
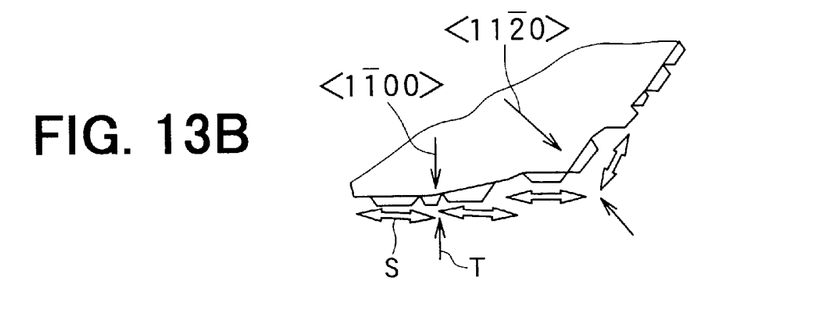
FIG. 13B is an explanation view showing a generation mechanism of crack defects which are generated as a SiC crystal grows.

Since atoms are liable to be arranged on a plane $<1\bar{1}00>$, the SiC crystal grows slower in a direction $<11\bar{2}0>$ than in a direction $<1\bar{1}00>$ as shown in FIG. 13B. Therefore, when it is supposed that the SiC crystal grows in a large free space, as the circular SiC crystal shown in FIG. 13A is enlarged in its radial direction, it becomes a hexagon shape which protrudes in the direction $<11\bar{2}0>$.

Figure 13C:
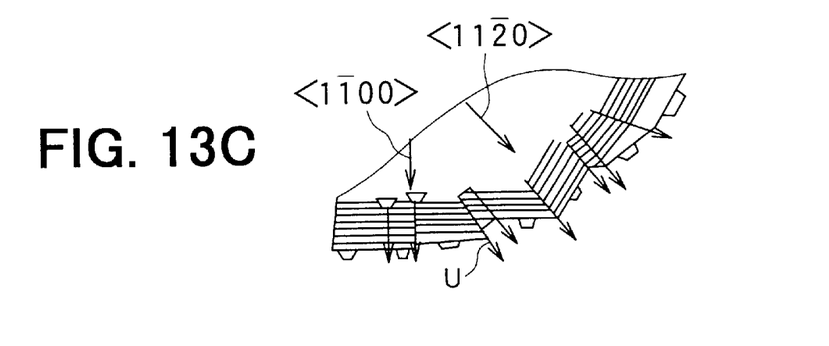
FIG. 13C is an explanation view showing a generation mechanism of crack defects which are generated as a SiC crystal grows.

As shown in FIG. 13B, atoms (indicated by arrows S) moving on the plane $<1\bar{1}00>$ collide with each other due to defects and some lattice mismatching so that a crack core is generated at their collision position (indicated by an arrow T). As the SiC crystal grows, crack defects are generated to extend in the directions $<1\bar{1}00>$ and $<11\bar{2}0>$, as indicated by arrows U shown in FIG. 13C, from the collision core.

What is needed then is a crystal producing method and apparatus that does not suffer from the above limitations. This in turn, will provide a method and apparatus that eliminates the problem of producing SiC crystals that are of a size and shape that require extensive additional processing after forming to produce them in the shape of a wafer, and provide a SiC crystal producing method and apparatus that is capable of producing a SiC crystal free of crack defects, even those originating at a crack core.

SUMMARY OF THE INVENTION

In accordance with the teachings of the present invention, a method and apparatus for producing silicon carbide (Sic) crystal is disclosed. The present invention has been made in view of the above problems. Thus, a first object of the present invention is to produce a SiC crystal in a precise size and shape similar to a wafer, so the Sic crystal can be used in a manner similar to that in which a Sic wafer is used. A second object of the present invention is to restrict and control the crack cores, which prevent the generation of crack defects.

In order to achieve the objects of the present invention, there is provided a wall member disposed around the SiC crystal substrate so as to cover a peripheral portion of the SiC crystal substrate. This acts to control the growth of the SiC crystal toward the wall member. Additionally, by setting the temperature of the wall member higher than the sublimation temperature of the SiC when the Sic crystal is grown, SiC crystal growth is controlled. In this manner, a peripheral portion of the SiC crystal is covered by the wall member, so that the SiC crystal growth can be controlled in a radial direction with the wall member having a high temperature which controls the shape of the SiC crystal. Producing a Sic crystal in a wafer shape is desirable to eliminate any post-production forming or machining.

In one example, the wall member is constructed in a substantially circular tube shape whose inner diameter is larger than a diameter of the SiC crystal substrate, and the SiC crystal substrate is disposed within a hollow of the wall member. Therefore, the SiC crystal can be produced in a substantially cylindrical shape. When the wall member is formed in a substantially circular tube shape but with a cross-section having an arc portion corresponding to an orientation flat, the SiC crystal having an orientation flat (flat portion) can be produced. When the wall is formed in a substantially hexagonal tube shape and the silicon carbide crystal substrate is disposed within a hollow of the wall member, the SiC crystal can be produced in a substantially hexagonal pole shape.

When alignment is made between a shape of the wall member and any one specific direction of the SiC crystal substrate, the SiC crystal can be produced in a shape according to the alignment. When the wall member is formed in a cone shape so that the SiC crystal is enlarged in a radial direction as it grows, its diameter can be controlled. The wall member is formed in a cone shape so that its cross-section is substantially circular around the SiC crystal substrate and is changed into a hexagonal shape in a crystal growing direction of the SiC crystal. Therefore, a cross-sectional shape of the SiC crystal can be changed as it grows. For instance, the wall member can be formed in a cone shape so as to be inclined at 5 to 80 degrees with respect to a direction perpendicular to a surface of the SiC crystal substrate. The wall member is formed so that a clearance between the wall member and the SiC crystal substrate is set at 5 to 30 percent of a radius of the SiC crystal substrate. Therefore, SiC crystal growth is possible in the radial direction utilizing the heat of the wall member which facilitates the growth of the SiC crystal.

Further, the method of producing a SiC crystal according to the present invention can be performed using an apparatus. A SiC seed crystal is disposed in a container and a SiC crystal is grown on the SiC crystal substrate by supplying sublimation gas from a SiC material onto the SiC crystal substrate. Further, a wall member having a hexagonal hollow is disposed so as to cover a peripheral portion of the SiC crystal substrate, and the SiC crystal grows along the inner wall surfaces defining the hexagonal hollow. In this manner, since the SiC crystal grows along the inner wall surfaces defining the hollow, an ingot of the SiC crystal can be formed in an ideal hexagonal pole shape constructed by flat crystal growing surfaces, thereby preventing the generation of crack defects growing from crack cores.

The SiC crystal substrate is disposed so that its planes coincide with the inner wall surfaces of the wall member thereby defining a hexagonal pole hollow. Therefore, generation of cracks due to atomic collisions within the crystal growing surface of the SiC crystal can be prevented. Accordingly, even when a radial dimension of the SiC crystal substrate is smaller than an inner radial dimension between the inner wall surfaces defining the hollow of the wall member, generation of cracks due to atomic collision within the crystal growing surface of the SiC crystal can be prevented.

The SiC crystal substrate has the planes of a particular form to create a substantially hexagonal pole shape. Accordingly, a shape of the SiC substrate conforms to a shape of the SiC crystal, thereby restricting crack generation during an initial crystal growth. A dimension of the wall member is made larger than a dimension of the SiC crystal during its growth, so that the SiC crystal grows along the inner wall surfaces of the wall member, thereby making its growing surface flat. Similarly, a dimension of the wall member is made smaller than a dimension of the SiC crystal, having grown in the growing direction of the SiC crystal, and the SiC crystal is grown so as to have planes forming a substantially hexagonal pole shape after passing along the wall member.

Although the SiC crystal having grown along the wall member in an ideal shape, has sufficient free space, the SiC crystal continues to grow while the substantially hexagonal pole shape, constructed by the planes of a particular form, is maintained. Accordingly, a SiC crystal ingot can be formed in an ideal hexagonal pole shape constructed by flat crystal growing surfaces, thereby preventing the crack cores from generating the crack defects.

Furthermore, the SiC crystal grows along the inner wall member surface after the SiC crystal grows to reach the wall member. This occurs when an inner radial dimension between the inner wall surfaces defining the hollow of the wall member is made smaller than a radial dimension of the SiC crystal substrate, and the wall member is disposed forward of the SiC crystal substrate in the growing direction of the SiC crystal. According to this manner as well, the SiC crystal, having grown in an ideal shape using the wall member, grows while the substantially hexagonal pole shape constructed by the planes of a form is maintained, thereby restricting the crack cores from generating the crack defects.

The container has a hexagonal pedestal, and the SiC crystal substrate is disposed on the hexagonal pedestal so as to cover the entire pedestal. Since the pedestal is made hexagonal, temperature distribution of the SiC crystal substrate can be uniformly maintained. Each side of the hexagonal SiC crystal substrate is made larger than each side of the hexagonal pedestal. Accordingly, since the temperature of the SiC crystal substrate outside the pedestal becomes high, the SiC crystal growing thereon is sublimated by thermal etching, thereby eliminating crystal defects thereon, and at the crack cores. Since the inner surfaces of the wall member are inclined with respect to the growing direction of the SiC crystal, SiC crystal growth can be restricted or controlled so as to be enlarged in the radial direction. The wall member is formed so that an inner radial dimension between the inner wall surfaces thereof is enlarged in the growing direction of the SiC crystal. Accordingly, when the wall member is constructed at an angle so that the SiC crystal is restricted from being enlarged in the radial direction, crystal defects can be prevented from being generated at a peripheral portion of the SiC crystal.

Further areas of applicability of the present invention will become apparent from the detailed description provided hereinafter. It should be understood that the detailed description and specific examples, while indicating preferred embodiments of the invention, are intended for purposes of illustration only, since various changes and modifications within the spirit and scope of the invention will become apparent to those skilled in the art from the detailed description, the appended claims and the accompanying drawings.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Embodiments of a method and apparatus for producing SiC crystal according to this invention will be described with reference to the accompanying drawings.

Figure 1A:
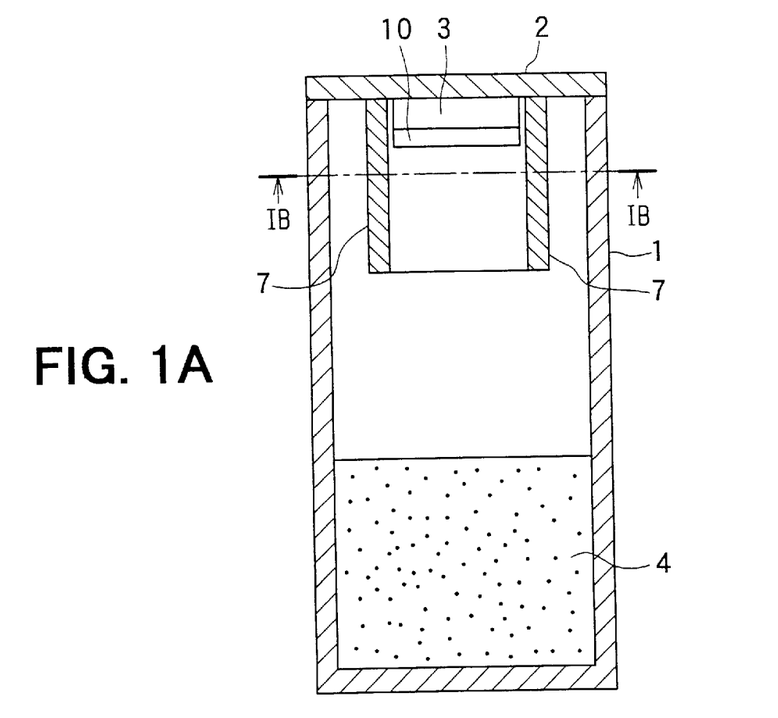
FIG. 1A is a schematic view showing the entire construction of a crystal growth apparatus used in a first embodiment of the present invention.

In a first embodiment, FIG. 1A shows a graphite crucible as a crystal growth apparatus. The graphite crucible includes a crucible body 1 which has a substantially circular tube shape with an open upper portion, and a cover member 2 for closing the open portion of the crucible body 1. The SiC crystal substrate 3 is disposed on the cover member 2 as a pedestal, and the Sic material powder 4 occupies the bottom portion of the crucible body 1. The SiC material powder 4 is sublimated in order to supply the SiC crystal substrate 3 as a feed crystal, so that a SiC crystal 10 grows on a surface of the SiC crystal substrate 3. A guide 7 acts as a wall member and is provided on the cover member 2 of the graphite crucible. The guide 7 will be described in greater detail with reference to FIG. 1B, which is a cross-sectional view showing the crystal growth apparatus taken along line 1b—1b in FIG. 1A.

Figure 1B:
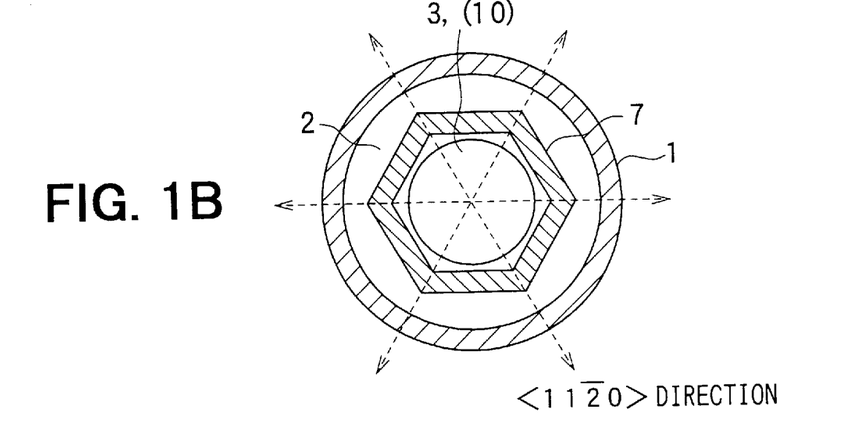
FIG. 1B is a cross-sectional view of a crystal growth apparatus used in a first embodiment of the present invention, taken along line IB—IB of FIG. 1A.

As shown in FIGS. 1A and 1B, the guide 7, having a substantially hexagonal tube shape, covers a peripheral portion of the SiC crystal substrate 3 as a feed crystal, and it is composed of carbon, for example. The SiC crystal substrate 3 is disposed so as to align a plane direction of the SiC crystal substrate 3 and each corner of the substantially hexagonal shaped guide 7. For example, this alignment is made between each diagonal 5 and 6 (FIG. 1B) passing through a center of the hexagonal shape and corresponding to a direction such as <11$\bar{2}$0> of the SiC crystal substrate 3. Specifically, since a plane direction of the Sic crystal substrate 3 can be accurately determined by a Laue photograph using X-ray diffraction or the like, a plane direction of the SiC crystal substrate 3 is determined before the SiC crystal substrate 3 is attached to the cover member 2. Thereafter, the SiC crystal substrate 3 is attached to the cover member 2 so as to accurately align the plane direction and the diagonal of the guide 7.

Further, a dimension between inner surfaces of the guide 7 facing each other is a little larger than a diameter of the SiC crystal substrate 3. When the SiC crystal 10 grows on the SiC crystal substrate 3, the dimension between inner surfaces of the guide 7 is set so that the SiC crystal can be restricted from being enlarged in its radial direction due to the temperature of the guide 7.

Although not shown in the drawings, the graphite crucible can be heated by a heater in a vacuum chamber into which an argon gas can be introduced. A temperature of the SiC crystal substrate 3 as a feed crystal can be maintained to be lower by 100° C. than the temperature of the SiC material powder 4 by adjusting the electrical power supplied to the heater.

Next, a description pertaining to a method of producing a SiC crystal using a crystal growth apparatus as constructed in this manner will be made with continued reference to FIGS. 1A and 1B. First, the SiC material powder 4 is heated so that its temperature is set at 2000 to 2500° C. By heater adjustment, a temperature gradient is set in the graphite crucible so that the temperature of the SiC substrate 3 is lower than the temperature of the SiC material powder 4. Next, pressure in the graphite crucible is set at 13.3 Pa to 6.65 kPa, and crystal growth begins when the SiC material powder 4 is sublimated thereby generating sublimation gas which reaches the SiC substrate 3. SiC crystal growth occurs on a surface of the SiC substrate 3 whose temperature is lower than the temperature of the SiC material powder 4.

At this time, the guide 7 is disposed around the SiC crystal substrate 3, and temperature of the guide 7 becomes high due to the heat transmitted from the graphite crucible 1. Therefore, the SiC crystal 10 growing on the SiC crystal substrate 3 receives heat from the guide 7, so that the SiC crystal 10 is restricted from being enlarged in its radial direction. The guide 7 is situated so as to cover the SiC crystal substrate 3 in such a way as to cause the SiC crystal 10 to be formed in a substantially hexagonal pole shape. Therefore, a shape of the SiC crystal 10 can be arbitrarily changed by changing the shape of the guide 7, thereby permitting the SiC crystal 10 to be grown in a shape which may finally be used as a wafer.

Figure 2A:
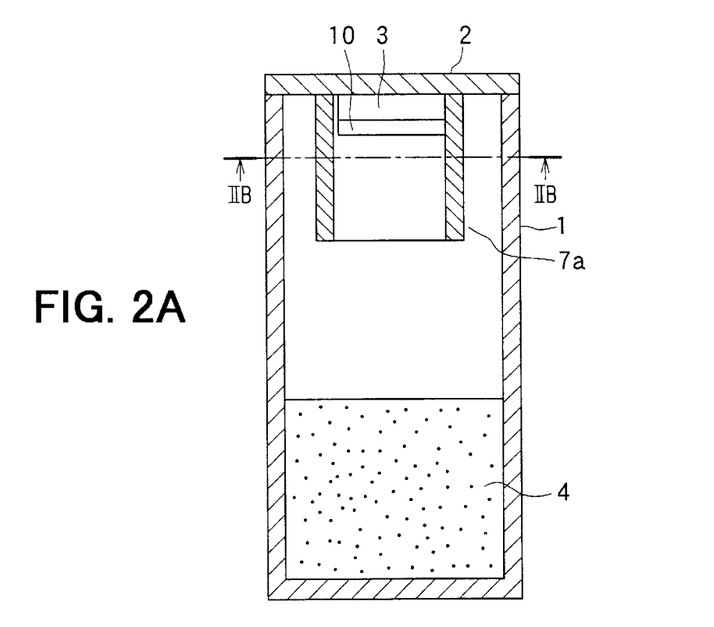
FIG. 2A is a schematic view showing the entire construction of a crystal growth apparatus used in a second embodiment of the present invention.
Figure 2B:
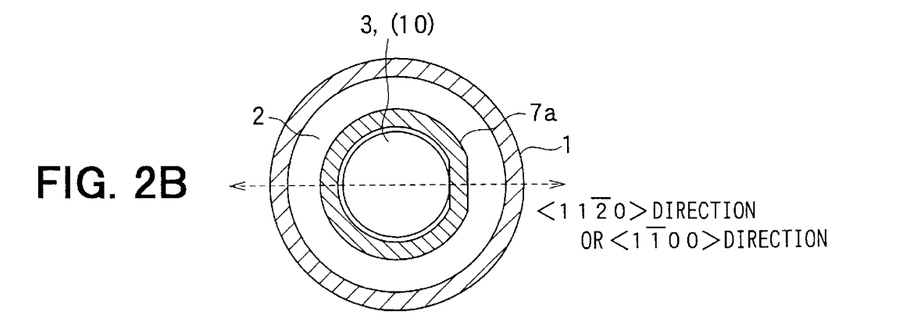
FIG. 2B is a cross-sectional view of the crystal growth apparatus used in a second embodiment of the present invention, taken along line IIB—IIB of FIG. 2A.

FIG. 2A shows the entire construction of a crystal growth apparatus according to a second embodiment, and FIG. 2B is a cross-sectional view showing the crystal growth apparatus taken along line IIB—IIB of FIG. 2A. In the second embodiment, since the crystal growth apparatus includes much of the same construction as the first embodiment, this description will pertain to portions different from the first embodiment.

As shown in FIGS. 2A and 2B, the shape of the guide 7a is changed from that in the first embodiment. Specifically, the guide 7a is substantially a circular tube shape with a portion cut off as a notch so that its cross-section is missing an arc portion. A hollow of the guide is provided in the shape of a semiconductor having an orientation flat. The SiC crystal substrate 3 is disposed so as to align a surface of the notch and a plane direction of the crystal substrate 3. For example, aligning a line 8 which passes through a center of the circular tube shape and a center of the notch surface, and the direction <11$\bar{2}$0> or <1$\bar{1}$00> of the SiC crystal substrate 3 as FIG. 2b shows.

An inner diameter of the guide is larger than the diameter of the SiC crystal substrate 3 as a seed crystal. Specifically, the inner diameter is set at a dimension so as to restrict the SiC crystal 10, growing on the seed crystal, from being enlarged in its radial direction. When the SiC crystal 10 is grown on the seed crystal in the same process as in the first embodiment, because the temperature of the guide becomes high, the SiC crystal 10 is restricted from being enlarged in its radial direction and is formed in a shape in accordance with the shape of the guide 7a. Accordingly, the SiC crystal 10 is formed having a bulk shape with an orientation flat.

Characteristics of a crystal vary in accordance with its plane direction, and machining difficulty of a grown crystal changes in accordance with machining direction. A plane direction is required to be determined using X-ray measurement to provide the location of an orientation flat. In the second embodiment, however, the SiC crystal 10 with an orientation flat can be obtained, and such machining difficulty can be eliminated.

When a grown crystal includes an orientation flat, its plane direction can be found without using X-ray measurement, thereby simplifying processes after crystal growth. If a grown crystal is taken from the graphite crucible and its plane direction measured, the process is time consuming and troublesome. In the case of machining a difficult material such as a SiC crystal, the difficulty becomes larger.

Figure 3A:
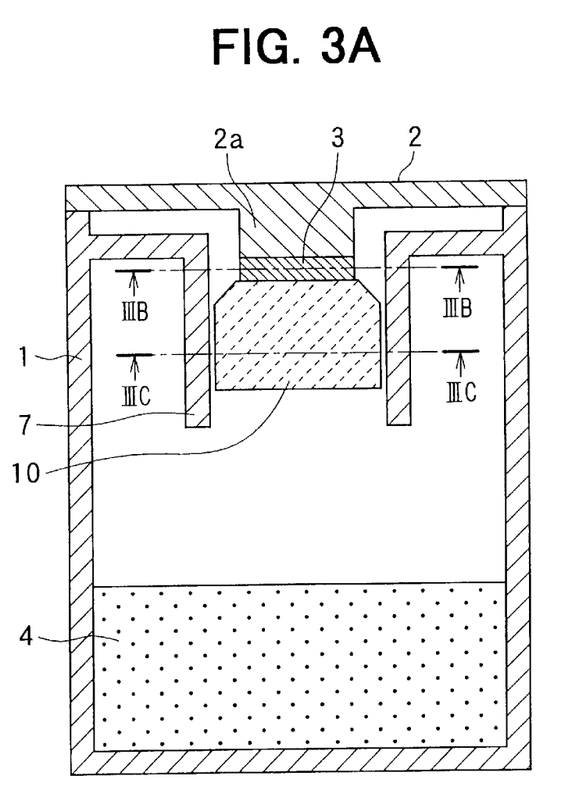
FIG. 3A is a schematic view showing the entire construction of a crystal growth apparatus used in a third embodiment of the present invention.
Figure 3B:
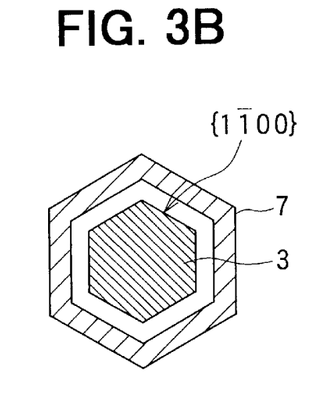
FIG. 3B is a cross-sectional view showing a crystal growth apparatus used in a third embodiment of the present invention, taken along line IIIB—IIIB of FIG. 3A.
Figure 3C:
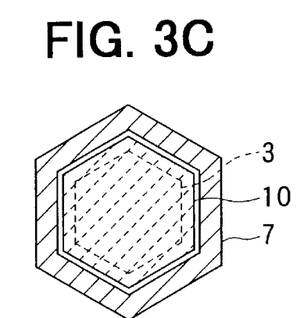
FIG. 3C is a cross-sectional view showing a crystal growth apparatus used in a third embodiment of the present invention, taken along line IIIC—IIIC of FIG. 3A.

FIG. 3A shows the entire construction of a crystal growth apparatus according to a third embodiment, FIG. 3B is a cross-sectional view showing the crystal growth apparatus taken along line IIIB—IIIB in FIG. 3A, and FIG. 3C is a cross-sectional view showing the crystal growth apparatus taken along line IIIC—IIIC in FIG. 3A. In the third embodiment, since the crystal growth apparatus includes nearly the same construction as in the first embodiment, the description will be limited to new portions.

As shown in FIG. 3A, a pedestal 2a is provided on the cover member 2, and the SiC crystal substrate 3 as the feed crystal is disposed on a surface of the pedestal 2a. As shown in FIG. 3B, the SiC crystal substrate 3 lies over the pedestal 2a of FIG. 3A. The pedestal 2a has a hexagonal cross-section while the SiC crystal substrate 3 is formed in a hexagonal pole shape and has planes of a form {1$\bar{1}$00} as FIG. 3B shows. Because both of the pedestal 2a and the SiC crystal substrate 3 are formed in a hexagonal shape, the temperature of a surface of the SiC crystal substrate 3 can more uniformly be maintained.

A size of a hollow portion of the guide 7 (radial dimension between a center of the guide 7 and an inner wall surface thereof) is made to be larger than a size of the SiC crystal substrate 3 (radial dimension between a center of the SiC crystal substrate 3 and a peripheral surface thereof), so that the SiC crystal 10 can be enlarged in the radial direction of the SiC crystal substrate 3 as the SiC crystal 10 grows. As shown in FIG. 3A, the SiC crystal 10 on the SiC crystal substrate 3 grows to reach the inner wall surfaces defining the hexagonal hollow, and thereafter it grows along and parallel to the inner wall surfaces. At this time, each inner wall surface of the guide 7 coincides with the planes of a form {1$\bar{1}$00} of the SiC crystal 10 as shown in FIG. 3b. Accordingly, the SiC crystal 10 has the planes of a form {1$\bar{1}$00} forming a substantially hexagonal pole shape, and a shape of the SiC crystal 10 seen from a crystal growing direction which is similar to a cross-sectional shape of the guide 7 as also seen in FIG. 3B.

Since temperature of the guide 7 becomes high due to heat transmitted from the graphite crucible, the SiC crystal 10 grows while a very small clearance is provided between the guide 7 and the SiC crystal 10 by receiving heat from the guide 7. Therefore, the SiC crystal 10 can be readily and easily removed from the guide 7. Furthermore, the guide 7 is formed so that its dimension is larger than a dimension of the SiC crystal 10 having grown in its crystal growing direction, so that the SiC crystal 10 always grows along the inner wall surfaces of the guide 7.

Since the SiC crystal 10 grows along the inner wall surfaces of the guide 7 (in the hollow thereof), an ingot of the SiC crystal can be formed in an ideal hexagonal pole shape constructed by the flat crystal growing surfaces. Therefore, the crack cores generating the crack defects can be limited or eliminated.

Further, the planes of a form {1$\bar{1}$00} of the SiC crystal 10 are made to coincide with the inner wall surfaces of the guide 7. Therefore, even when a size of the SiC crystal substrate 3 is smaller than a size of the hollow portion of the guide 7, cracks due to atomic collision within the crystal growing surface of the SiC crystal 10 can be prevented. Furthermore, since the SiC crystal substrate 3 as the feed crystal is formed in a hexagonal shape constructed by the planes of a form {1$\bar{1}$00}, the shape of the SiC substrate 3 conforms to the shape of the SiC crystal 10, thereby restricting crack generation from an initial crystal growth.

Figure 4:
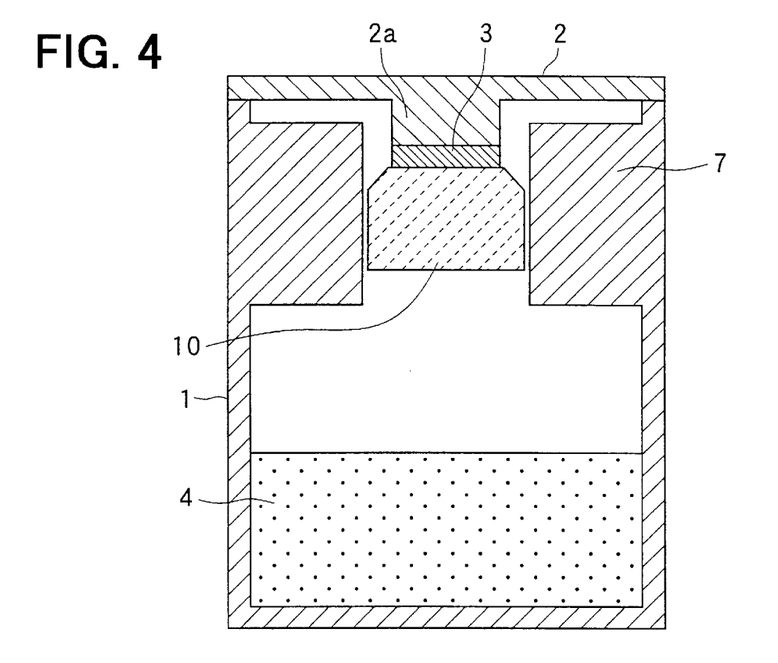
FIG. 4 is a schematic view showing the entire construction of a crystal growth apparatus in a modification of the third embodiment.
Figure 5:
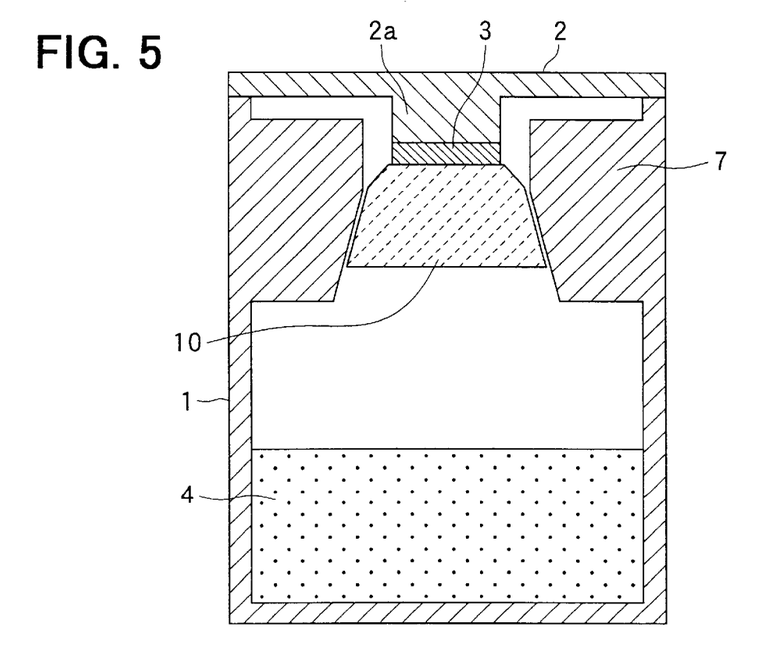
FIG. 5 is a schematic view showing the entire construction of a crystal growth apparatus in an additional modification of the third embodiment.

Although the third embodiment of FIGS. 3A–3C shows the guide 7 formed using a cylindrical hollow member having a thin wall, the guide 7 can be formed using a thick member which is formed by reducing an inner diameter of the crucible body 1 as shown in FIG. 4. Although the inner wall surfaces of the guide 7 are parallel to the crystal growing direction of the SiC crystal 10 in the third embodiment, they can be provided so that the inner diameter is enlarged in the crystal growing direction, as the guide 7 shows in FIG. 5. FIG. 5 is another schematic view showing the entire construction of a crystal growth apparatus in yet another modification of the third embodiment.

Figure 6A:
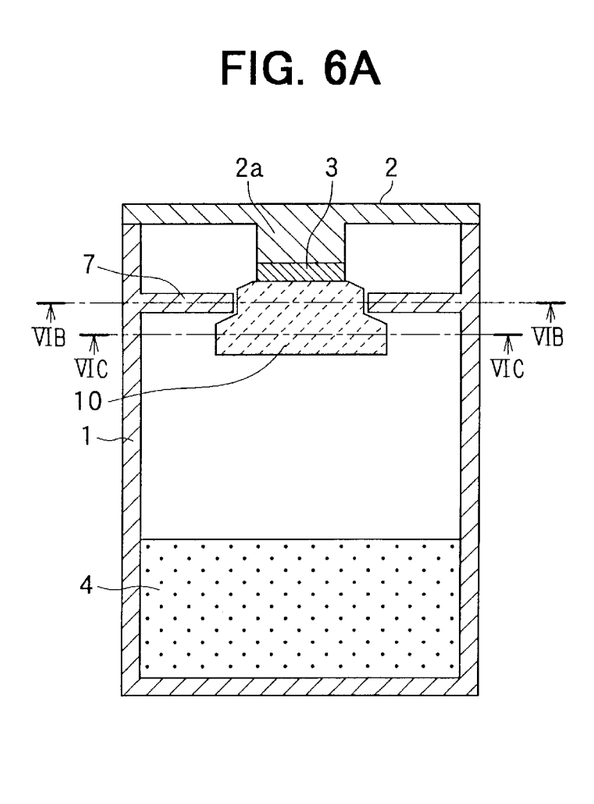
FIG. 6A is a schematic view showing the entire construction of a crystal growth apparatus used in a fourth embodiment of the present invention.
Figure 6B:
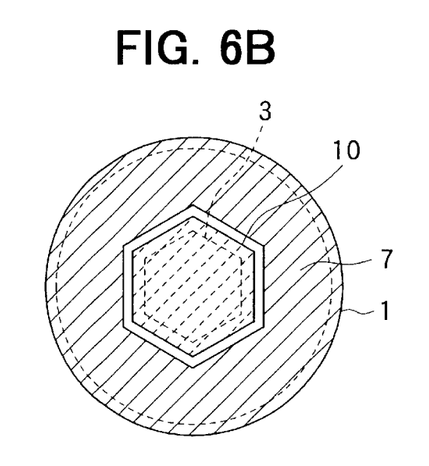
FIG. 6B is a cross-sectional view showing the entire construction of a crystal growth apparatus used in a fourth embodiment of the present invention, taken along line VIB—VIB of FIG. 6A.
Figure 6C:
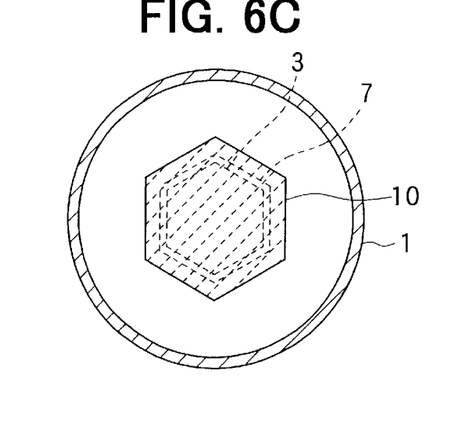
FIG. 6C is a cross-sectional view showing the entire construction of a crystal growth apparatus used in a fourth embodiment of the present invention, taken along line VIC—VIC of FIG. 6A.

FIG. 6A shows an entire construction of a crystal growth apparatus according to a fourth embodiment, FIG. 6B shows a cross-sectional view of the crystal growth apparatus taken along line VIB—VIB in FIG. 6A, and FIG. 6C is a sectional view showing the crystal growth apparatus taken along line VIC—VIC in FIG. 6A. In the fourth embodiment, since the crystal growth apparatus primarily comprises the same construction as the third embodiment, this description will address primarily the new references.

In the fourth embodiment of FIGS. 6A–6C, the guide 7 is formed in a disk shape where a hexagonal hollow is provided. The guide 7 is designed to accommodate the SiC crystal growing within the guide 7. The guide 7 is located forward of the SiC crystal substrate 3 in the crystal growing direction. In such a case, although the SiC crystal 10 grows through the guide 7 in an ideal shape, and has sufficient free growing space as shown in FIG. 6A, the SiC crystal 10 grows conforming to the substantially hexagonal pole shape constructed by planes as shown in FIG. 6C. Accordingly, a SiC crystal ingot can be formed in an ideal hexagon pole shape constructed by flat crystal growing surfaces, thereby preventing the crack cores from generating any crack defects.

Figure 7A:
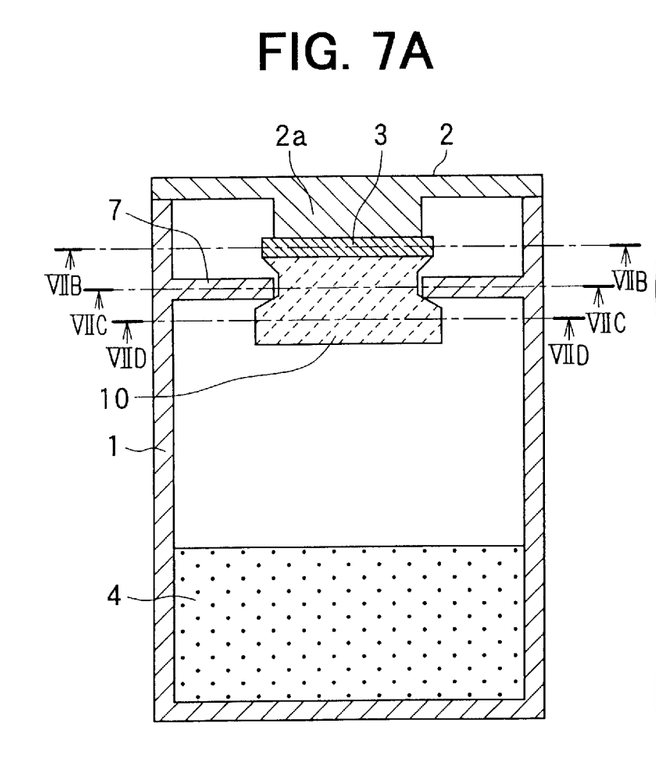
FIG. 7A is a schematic view showing the entire construction of a crystal growth apparatus used in a fifth embodiment of the present invention.
Figure 7B:
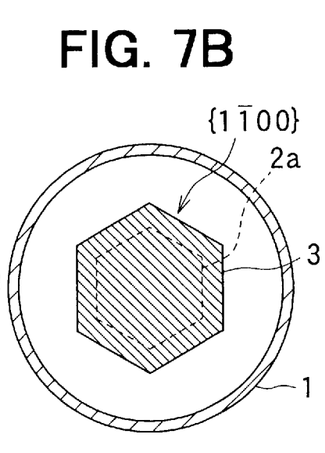
FIG. 7B is a cross-sectional view of the entire construction of a crystal growth apparatus used in a fifth embodiment of the present invention, taken along line VIIB—VIIB of FIG. 7A.
Figure 7C:
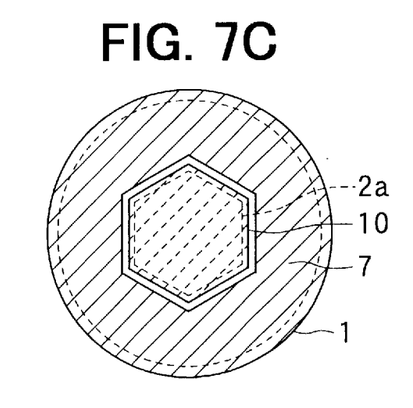
FIG. 7C is a cross-sectional view of the entire construction of the crystal growth apparatus used in a fifth embodiment of the present invention, taken along line VIIC—VIIC of FIG. 7A.
Figure 7D:
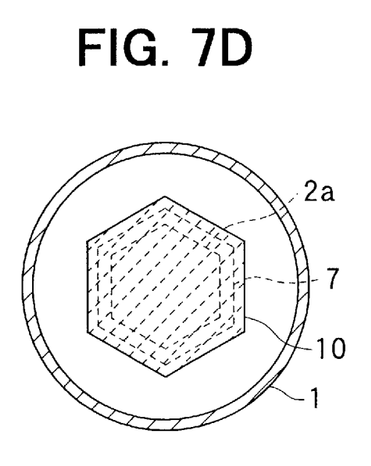
FIG. 7D is a cross-sectional view of the entire construction of the crystal growth apparatus used in a fifth embodiment of the present invention, taken along line VIID—VIID of FIG. 7A.

According to a fifth embodiment, FIG. 7A shows the entire construction of a crystal growth apparatus, FIG. 7B shows a cross-sectional view of the crystal growth apparatus taken along line VIIB—VIIB of FIG. 7A, FIG. 7C is a cross-sectional view showing the crystal growth apparatus taken along line VIIC—VIIC of FIG. 7A, and FIG. 7D is a cross-sectional view showing the crystal growth apparatus taken along line VIID—VIID of FIG. 7A. In the fifth embodiment, since the crystal growth apparatus includes much of the same construction as in the fourth embodiment, the description will address primarily the new references.

As shown in FIGS. 7A–7B, the size of the SiC crystal substrate 3 (dimension between a center the SiC crystal substrate 3 and a peripheral surface thereof) is made to be larger than the size of the pedestal 2*a* (dimension between a center of the pedestal 2*a* and a peripheral surface thereof). That is, any one of the sides of the SiC crystal substrate 3 is made to be larger than any one of the sides of the pedestal 2*a*, each having a hexagonal shape, so that the entire surface of the pedestal 2*a* is covered by the SiC crystal substrate 3 disposed on the pedestal 2*a*. Accordingly, since a temperature of the SiC crystal substrate 3 outside the pedestal 2*a* becomes high, the SiC crystal 10 growing thereon is sublimated by thermal etching, thereby eliminating any crystal defects caused by the crack cores. Further, a size of the hollow of the guide 7 is made to be smaller than a size of the Sic crystal substrate 3. In such a case, the SiC crystal 10 grows in its longitudinal direction while enlarged in its radial direction until it reaches the guide 7. At this time, the crack defects are generated on a peripheral portion of the SiC crystal 10.

When the SiC crystal 10 grows and reaches the guide 7, it continues growing in the smaller region of the hollow of the guide 7. That is, the SiC crystal 10 grows only at a portion where the crack defects are not generated, and it grows through the hollow of the guide 7 as a satisfactory SiC crystal. After growing through the guide 7, the SiC crystal 10 also grows in a radial direction. However, the SiC crystal 10, having grown in an ideal shape using the guide 7, grows while the substantially hexagon pole shape constructed by the planes of a form $\{1\bar{1}00\}$ is maintained, as shown in FIG. 7B. Accordingly, a SiC crystal ingot can be formed in an ideal hexagonal pole shape constructed by flat crystal growing surfaces, thereby preventing the crack cores from generating the crack defects.

In the fifth embodiment, although a dimension of the guide 7 is smaller than a dimension of the SiC crystal 10 in its crystal growing direction, the dimension of the guide 7 can be larger than the dimension of the SiC crystal 10 as in the third embodiment. In such a case, the SiC crystal 10 grows along the inner wall surfaces of the guide 7, and after reaching the guide 7, the crack core is prevented from generating the crack defects. FIGS. 7C and 7D show additional cross-sectional views of the crystal growing process depicted in FIG. 7A showing the location of the cover member 2*a* relative to the guide 7.

Figure 8A:
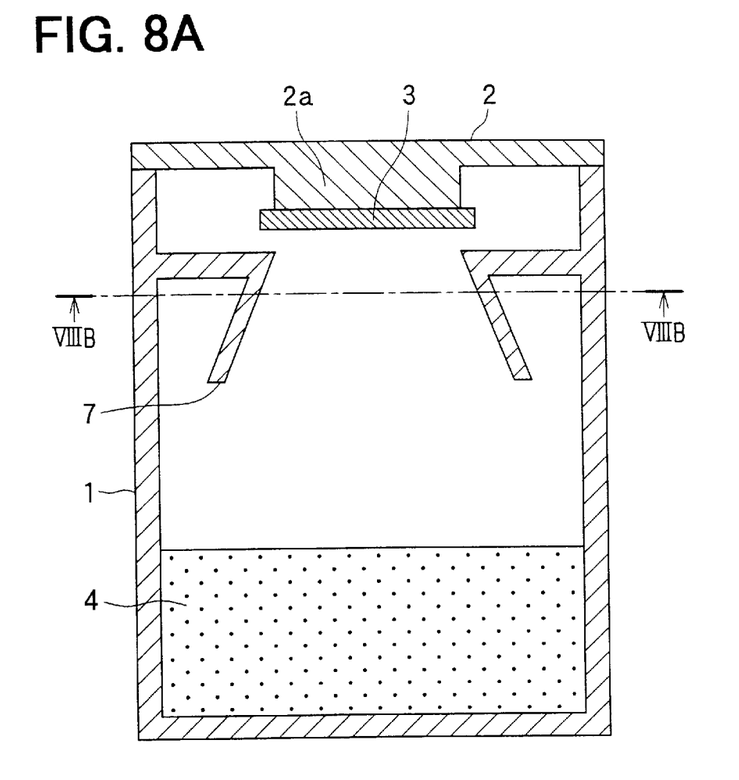
FIG. 8A is a schematic view showing the entire construction of a crystal growth apparatus in a modification of the fifth embodiment.
Figure 8B:
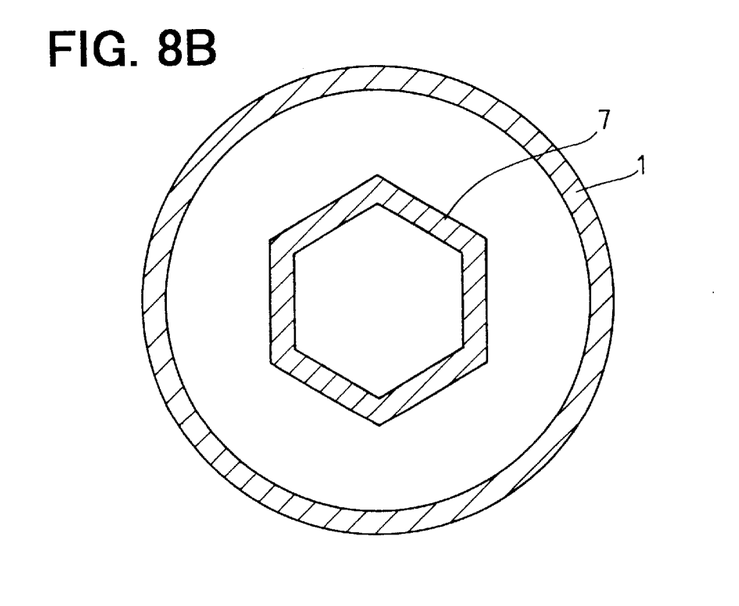
FIG. 8B is a cross-sectional view of the entire construction of a crystal growth apparatus in a modification of the fifth embodiment, taken along line VIIIB—VIIIB of FIG. 8A.

In a modification of the fifth embodiment, as shown in FIGS. 8A and 8B, the guide 7 can be constructed so that the inner wall surface is angled with respect to the crystal growing direction of the SiC crystal 10 causing the hollow of the guide 7 to be flared. For example, an angle of the wall of the guide 7 can be set at 5–80 degrees from a vertical position. When the guide 7 is constructed at an angle so that the SiC crystal 10 is restricted from being enlarged in its radial direction, crystal defects can be prevented from being generated at a peripheral portion of the SiC crystal 10. Although the SiC crystal 10 can be restricted from being enlarged in the radial direction using a tilt angle between 0 and 30 degrees, it is determined by a temperature difference between the SiC material powder 4 and a crystal growing surface of the SiC crystal 10, whether this restriction is made or not. FIG. 8B shows in cross-section, the shape of the guide 7 taken at line VIIIB—VIIIB of FIG. 8A.

Figure 9:
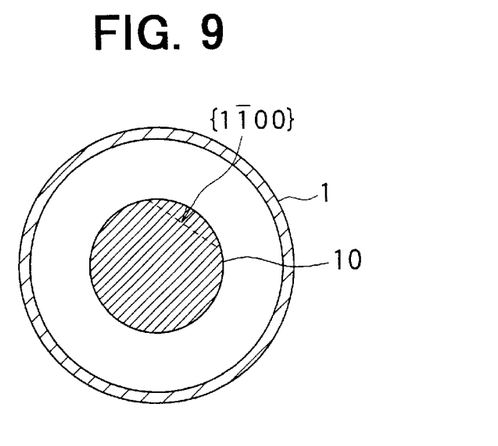
FIG. 9 is a schematic view showing the entire construction of a crystal growth apparatus in another modification of the fifth embodiment.

The fifth embodiment describes the case where the SiC crystal substrate 3 as a seed crystal has a hexagonal shape. Since the shape of the growing SiC crystal 10 can be restricted by the guide 7, it is permissible for the SiC crystal substrate 3 to have another shape, for example, a circular shape as shown in FIG. 9. This circular shape is permissible if the grown SiC crystal 10 has a satisfactory portion with no crack defects, that is, around the inner wall surface of its guide. If the SiC crystal 10 can be restricted from being enlarged in its radial direction, the effects of the fifth embodiment can be obtained. Therefore, it is permissible for the guide 7 of FIGS. 7A–7D to have a circular shape to produce the effect of FIG. 9, which is a modification of the fifth embodiment.

Figure 10:
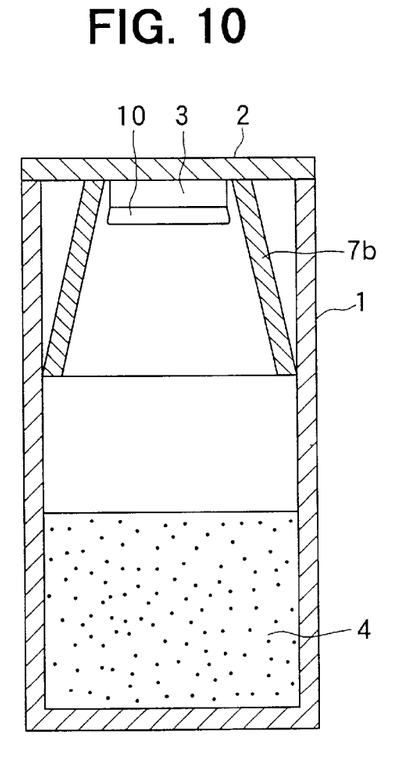
FIG. 10 is a schematic view showing the entire construction of a crystal growth apparatus in another embodiment of the present invention.

In embodiments 1 through 5, although the guide 7 has a hexagonal tube shape or a circular tube shape with a notch, other shapes are possible. For example, with reference to FIG. 10, if a diameter of the SiC crystal substrate 3 is small and a diameter of the SiC crystal 10 is enlarged but controlled in the radial direction, a guide 7*b* is constructed. That is, although the guide 7*b* is constructed in a shape where the SiC crystal 10 is enlarged in its radial direction, it is constructed so that this enlargement amount is made smaller than an enlargement amount in a case where the guide 7*b* is not provided.

Figure 11:
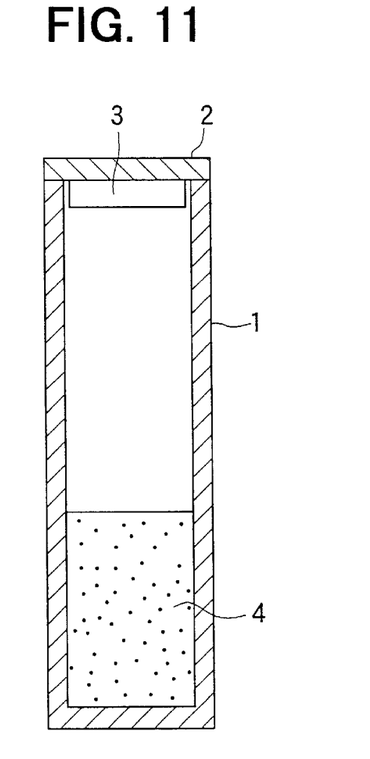
FIG. 11 is a schematic view showing the entire construction of a crystal growth apparatus in another embodiment of the present invention.

In the above embodiments, although a shape of the SiC crystal 10 is controlled by separately providing the guide 7 (see FIGS. 1–10), the same effects as in the above embodiments are obtainable by forming an inner wall of the graphite crucible in a typical shape of a guide as shown in FIG. 11. FIG. 11 shows the case where a crucible wall 1 is formed to be used as a guide. Also shown is a cover member 2, a SiC crystal substrate 3, and a silicon carbide (SiC) material powder 4.

Figure 12A:
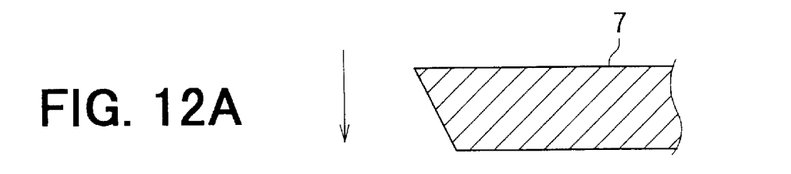
FIG. 12A is a schematic view showing part of the construction of a crystal growth apparatus in another embodiment of the present invention with an arrow noting a first SiC crystal growth direction.
Figure 12B:
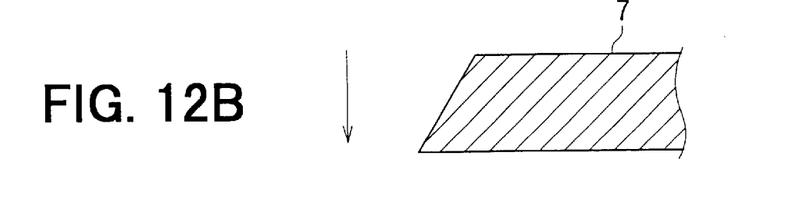
FIG. 12B is a schematic view showing part of the construction of a crystal growth apparatus in another embodiment of the present invention with a arrow noting a second SiC crystal growth direction.
Figure 12C:
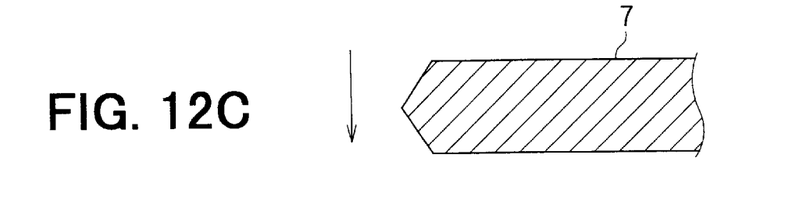
FIG. 12C is a schematic view showing part of the construction of a crystal growth apparatus in another embodiment of the present invention with an arrow noting a third SiC crystal growth direction.

In the above fifth embodiment, although an inner wall of the guide 7 is formed so that an inner wall surface is parallel to the growing direction of the SiC crystal 10, the inner wall surface of the guide 7 can be inclined to the growing direction of the SiC crystal 10 as shown in FIGS. 12A–12C. Each of FIGS. 12A–12C is an enlarged cross-sectional view showing the guide 7 at the right side taken in the growing direction of the SiC crystal 10 as in FIG. 7A. The growing direction of the SiC crystal is noted by the arrow on each of FIGS. 12A–12C.

For example, as shown in FIG. 12A, the inner wall of the guide 7 can be inclined outward in the growing direction of the SiC crystal 10. Accordingly, after the SiC crystal grows to reach the guide 7, it can grow while slowly enlarging in the radial direction. As shown in FIG. 12B, the inner wall of the guide 7 can be inclined inward in the growing direction of the SiC crystal. Accordingly, after the SiC crystal grows to reach the guide 7, it can be restricted from further enlargement in the radial direction, thereby eliminating the crack defects of the SiC crystal. As shown in FIG. 12C, the inner wall of the guide 7 can be first inclined inward in the growing direction of the SiC crystal, and then it can be inclined outward in the growing direction. Accordingly, both effects of the guides 7 shown in FIGS. 12A and 12B can be obtained. Again, the growing direction of the SiC crystal is noted by the arrow on each of FIGS. 12A, 12B, and 12C.

Additional advantages and modifications will readily occur to those skilled in the art. The invention in its broader terms is therefore, not limited to the specific details, representative apparatus, and illustrative examples shown and described.

What is claimed is:

1. A method of producing a silicon carbide crystal, comprising the steps of:
   providing a silicon carbide crystal substrate as a seed crystal disposed in a container;
   growing a silicon carbide crystal on the silicon carbide crystal substrate by supplying a sublimation gas of a silicon carbide material onto the silicon carbide crystal substrate;
   providing a wall member around the silicon carbide crystal substrate so as to cover a peripheral portion of the silicon carbide crystal substrate; and
   controlling the silicon carbide crystal by directing growth toward the wall member by setting a temperature of the wall member higher than a sublimation temperature of silicon carbide when the silicon carbide crystal is grown.

2. The method of producing a silicon carbide crystal according to claim 1, wherein:
   the wall member is constructed in a substantially circular tube shape whose inner diameter is larger than a diameter of the silicon carbide crystal substrate; and
   the silicon carbide crystal substrate is disposed within a hollow of the wall member.

3. The method of producing a silicon carbide crystal according to claim 2, wherein:
   the wall member is formed in a substantially circular tube shape whose cross-section has an arc portion corresponding to an orientation flat.

4. The method of producing a silicon carbide crystal according to claim 3, wherein:
   alignment is made between a direction perpendicular to the orientation flat and any one of directions <11$\bar{2}$0> and <1$\bar{1}$00> of the SiC crystal substrate.

5. The method of producing a silicon carbide crystal according to claim 1, wherein:
   the wall member is formed in a substantially hexagonal tube shape, and the silicon carbide crystal substrate is disposed within a hollow of the wall member.

6. The method of producing a silicon carbide crystal according to claim 5, wherein:
   alignment is made between any one of the corners of the wall member having the substantially hexagonal tube shape and any one of directions <11$\bar{2}$0> and <1$\bar{1}$00> of the silicon carbide crystal substrate.

7. The method of producing a silicon carbide crystal according to claim 1, wherein:
   the wall is formed in a conical shape so that the silicon carbide crystal is enlarged in a radial direction as it grows.

8. The method of producing a silicon carbide crystal according to claim 7, wherein:
   the wall is formed in a conical shape so that its cross-section is substantially circular around the silicon carbide crystal substrate and then transforms into a hexagonal shape in a crystal growing direction of the silicon carbide crystal.

9. The method of producing a silicon carbide crystal according to claim 7, wherein:
   the wall member is formed in a cone shape so as to be inclined at 5 to 80 degrees with respect to a direction perpendicular to a surface of the silicon carbide crystal substrate.

10. The method of producing a silicon carbide crystal according to claim 1, wherein:
    the wall member is formed so that a clearance between the wall member and the silicon carbide crystal substrate is set at 5 to 30 percent of a radius of the silicon carbide crystal substrate.

11. A method of producing a silicon carbide crystal, comprising the steps of:
    providing a silicon carbide crystal substrate as a seed crystal in a container;
    supplying sublimation gas of a silicon carbide material onto the silicon carbide crystal substrate causing growth of a silicon carbide crystal on the silicon carbide crystal substrate; and
    disposing a wall member, having a hexagonal hollow, so as to cover a peripheral portion of the silicon carbide crystal substrate;
    wherein the silicon carbide crystal grows along a plurality of inner wall surfaces defining the hexagonal hollow.

12. The method of producing a silicon carbide crystal according to claim 11, wherein the silicon carbide crystal, having grown along the inner wall surfaces defining the hexagonal hollow, has the planes of a form $\{1\bar{1}00\}$ forming a substantially hexagonal pole shape, and a cross-sectional shape of the silicon carbide crystal seen from a crystal growing direction has the same cross-sectional shape as the wall member.

13. The method of producing a silicon carbide crystal according to claim 12, wherein a small clearance is provided between the wall member and the silicon carbide crystal.

14. The method of producing a silicon carbide crystal according to claim 11, wherein the silicon carbide crystal substrate is disposed so that the planes of a form $\{1\bar{1}00\}$ thereof coincide with the inner wall surfaces of the wall member defining a hexagonal pole hollow.

15. The method of producing a silicon carbide crystal according to claim 14, wherein the silicon carbide crystal substrate has the planes of a form $\{1\bar{1}00\}$ forming a substantially hexagonal pole shape.

16. The method of producing a silicon carbide crystal according to claim 11, wherein a dimension between opposing wall members increases with the peripheral edge of a growing silicon carbide crystal in the growing direction of the silicon carbide crystal so that the silicon carbide crystal grows along and parallel to the inner surfaces of the wall member.

17. The method of producing a silicon carbide crystal according to claim 11, wherein a dimension between opposing flats of the wall member is made smaller than a diameter of the silicon carbide crystal, in the growing direction of the silicon carbide crystal; and the silicon carbide crystal is grown so as to have the planes of a form $\{1\bar{1}00\}$ forming a substantially hexagonal pole shape after passing through the hollow.

18. The method of producing a silicon carbide crystal according to claim 11, wherein:

an inner radial dimension between the inner wall surfaces defining the hollow of the wall member is made smaller than a radial dimension of the silicon carbide crystal substrate, and the wall member is disposed forward of the silicon carbide crystal substrate in the growing direction of the silicon carbide crystal; and the silicon carbide crystal grows along the inner surfaces of the wall member after the silicon carbide crystal grows to reach the wall member.

19. The method of producing a silicon carbide crystal according to claim 11, wherein:

an inner radial dimension between the inner wall surface defining the hollow of the wall member is made larger than a radial dimension of the silicon carbide crystal substrate; and the silicon carbide crystal is enlarged as it grows, the silicon carbide crystal growing along the inner surfaces of the wall member after it reaches the wall member.

20. The method of producing a silicon carbide crystal according to claim 19, wherein:

the container has a hexagonal pedestal, and the silicon carbide crystal substrate is disposed on the hexagonal pedestal.

21. The method of producing a silicon carbide crystal according to claim 20, wherein:

each side of the hexagonal silicon carbide crystal substrate is made larger than each side of the hexagonal pedestal; and the silicon carbide crystal substrate is disposed on the pedestal so as to cover an entire surface of the pedestal.

22. The method of producing a silicon carbide crystal according to claim 21, wherein the inner wall surfaces of the wall member are inclined with respect to the growing direction of the silicon carbide crystal.

23. The method of producing a silicon carbide crystal according to claim 22, wherein:

the wall member is formed so that an inner radial dimension between the inner wall surfaces thereof is enlarged in the growing direction of the silicon carbide crystal.

* * * * *